(12) United States Patent
Hsu et al.

(10) Patent No.: US 8,198,538 B2
(45) Date of Patent: Jun. 12, 2012

(54) CAPACITOR DEVICES HAVING MULTI-SECTIONAL CONDUCTORS

(75) Inventors: Chien-Min Hsu, Hsinchu (TW);
Min-Lin Lee, Hsinchu (TW);
Shinn-Juh Lai, Hsinchu (TW);
Huey-Ru Chang, Hsinchu (TW);
Ray-Fong Hong, Hsinchu (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 630 days.

(21) Appl. No.: 12/392,272

(22) Filed: Feb. 25, 2009

(65) Prior Publication Data

US 2009/0219668 A1 Sep. 3, 2009

Related U.S. Application Data

(60) Provisional application No. 61/032,788, filed on Feb. 29, 2008.

(51) Int. Cl.
*H05K 1/09* (2006.01)
(52) U.S. Cl. ........ 174/251; 361/763; 361/782; 361/328; 361/277; 361/290; 361/292; 361/301.4
(58) Field of Classification Search .................. 174/251; 361/763, 782, 328, 277, 290, 292, 301.4
See application file for complete search history.

(56) References Cited

U.S. PATENT DOCUMENTS

| | | | | |
|---|---|---|---|---|
| 5,517,385 A | * | 5/1996 | Galvagni et al. | 361/312 |
| 6,418,006 B1 | * | 7/2002 | Liu et al. | 361/277 |
| 6,452,776 B1 | | 9/2002 | Chakravorty | |
| 7,345,366 B2 | | 3/2008 | Jow et al. | |
| 7,440,254 B2 | * | 10/2008 | Gallant | 361/277 |
| 2003/0089522 A1 | * | 5/2003 | Dances | 174/260 |
| 2004/0124493 A1 | * | 7/2004 | Chua | 257/508 |
| 2004/0219706 A1 | * | 11/2004 | Wan | 438/53 |
| 2007/0062726 A1 | | 3/2007 | Chang et al. | |
| 2007/0063243 A1 | | 3/2007 | Yang et al. | |

FOREIGN PATENT DOCUMENTS

CN  1504066 A  6/2004

OTHER PUBLICATIONS

Chien-Min Hsu et al., U.S. Appl. No. 12/390,237, filed Feb. 20, 2009.
Huey-Ru Chang et al., U.S. Appl. No. 12/395,065, filed Feb. 27, 2009.

* cited by examiner

*Primary Examiner* — Tuan T Dinh
*Assistant Examiner* — Steven Sawyer
(74) *Attorney, Agent, or Firm* — Finnegan, Henderson, Farabow, GArrett & Dunner, LLP

(57) ABSTRACT

A capacitive device is provided. The capacitive device includes a first electrode and a second electrode below the first electrode and spaced apart from the first electrode, wherein at least one of the first electrode and the second electrode includes a plurality of conductive step sections, the plurality of conductive step sections having different heights. The capacitive device also includes an insulating region between the first electrode and the second electrode; and at least one slot formed on one of the first electrode and the second electrode.

14 Claims, 9 Drawing Sheets

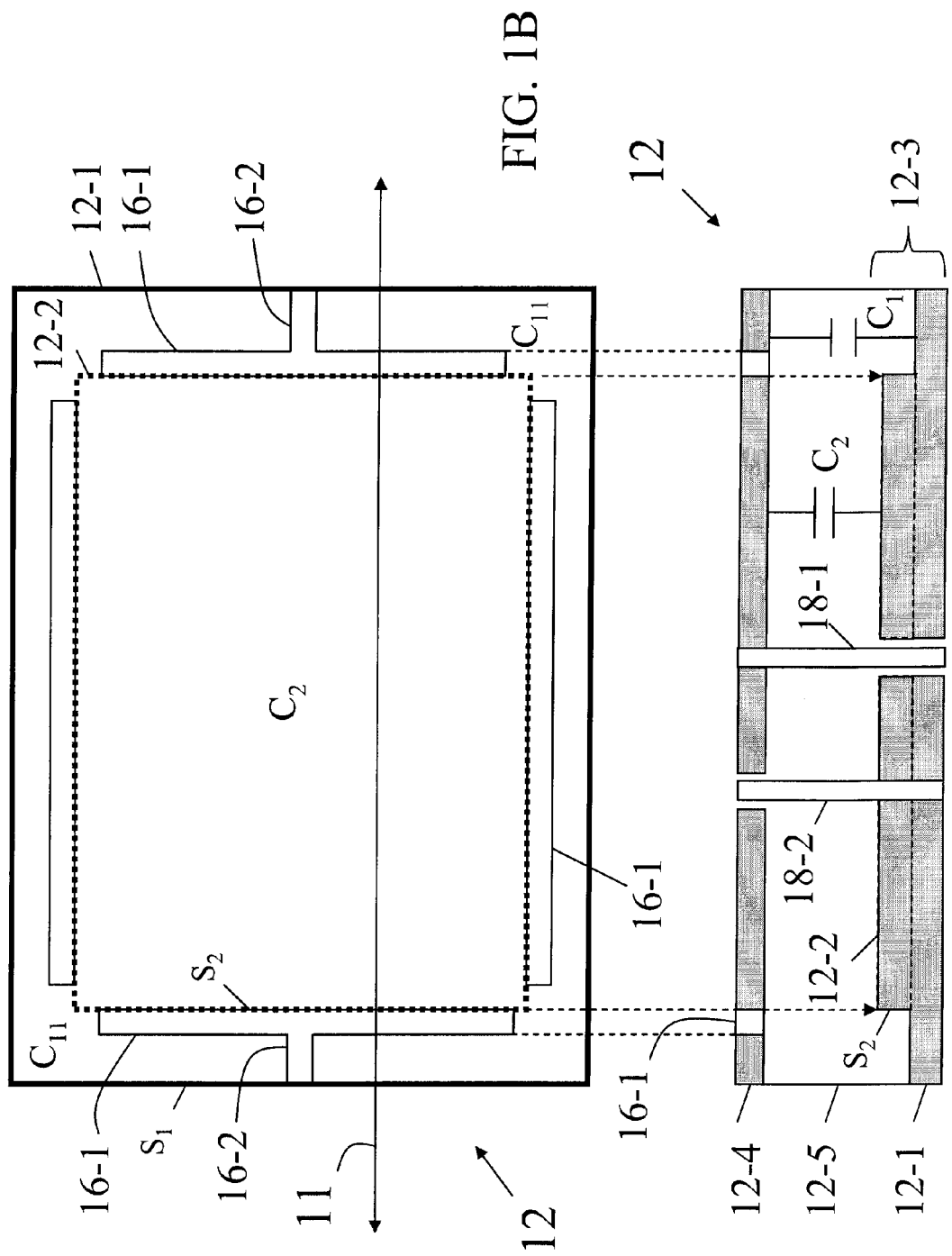

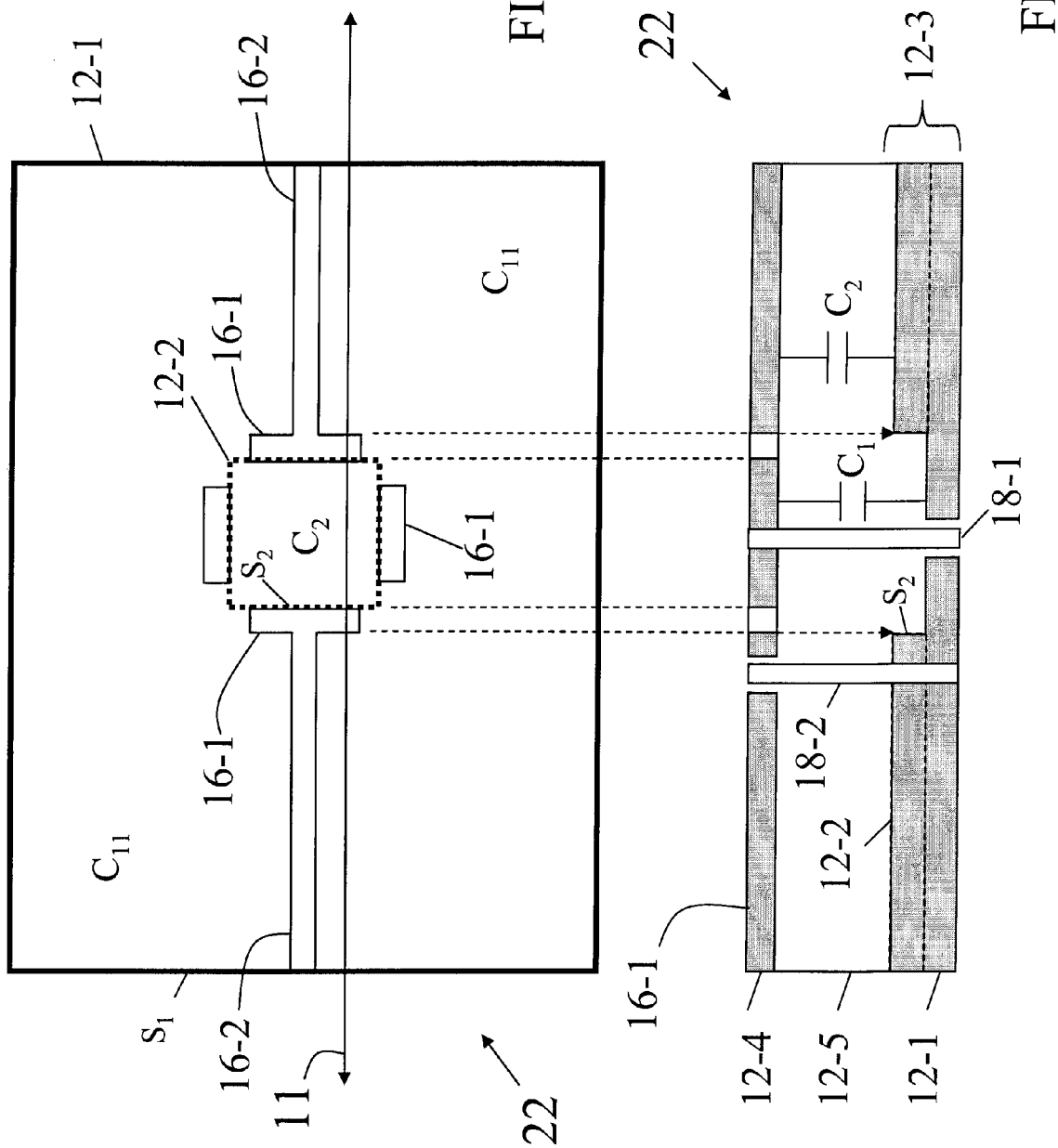

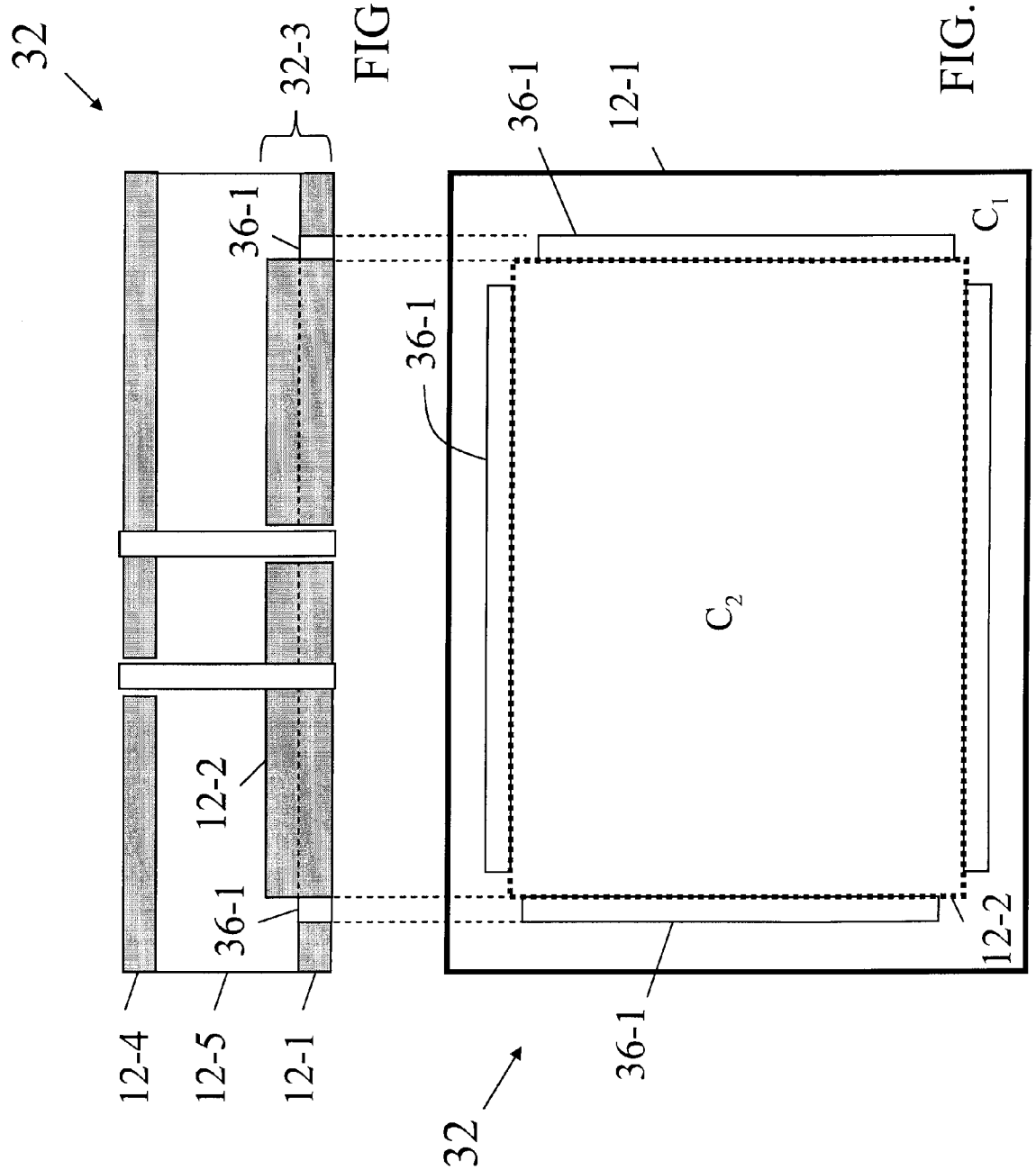

CAPACITOR DEVICES HAVING MULTI-SECTIONAL CONDUCTORS

CROSS-REFERENCE TO RELATED APPLICATIONS

This application claims the benefit of priority from U.S. Provisional Application No. 61/032,788, filed Feb. 29, 2008, the contents of which are hereby incorporated by reference in their entirety.

TECHNICAL FIELD

Embodiments disclosed herein relate to a capacitor device and, more particularly, to a capacitor device having multi-sectional conductors.

BACKGROUND

In general, capacitors are electrical devices capable of storing or absorbing electrical charges in time. Decoupling capacitors disposed near power/ground pins of electronic devices may be used to reduce undesirable noises. For example, surface mounted devices (SMDs) or embedded structures on or in printed circuit boards (PCBs) may reduce undesirable noises. Decoupling capacitors provide a localized source of direct-current (DC) power for electronic devices as the signals switch simultaneously at high speed.

With increasing signal transmission speed in ICs, unexpected interference resulting from power noises, ground bounces or simultaneous switching noises (SSN) may be serious and therefore may not be neglected for designers. However, parasitic inductances induced by conductive traces may become higher for decoupling capacitors and power delivery systems as the electronic devices operate at a relatively high frequency. Accordingly, it is difficult for decoupling capacitors to stabilize power supply level.

Capacitors embedded or buried in a PCB, IC substrate or interposer layer, have been proposed to replace the SMD capacitors for eliminating switching noise. However, capacitors embedded in PCBs or the substrates of ICs, may also exhibit more inductive than capacitive properties when they operate at a frequency greater than its resonant frequency. That is, the impedance of the embedded capacitors may increase as the operating frequency increases, resulting in degeneration of the decoupling performance for a power delivery network. As a result, how to reduce the impedance of the embedded capacitors and broaden the decoupling bandwidth are the critical issues for power integrity design.

BRIEF SUMMARY

Consistent with the disclosed embodiments, there is provided a capacitive device. The capacitive device includes a first electrode and a second electrode below the first electrode and spaced apart from the first electrode, wherein at least one of the first electrode and the second electrode includes a plurality of conductive step sections, the plurality of conductive step sections having different heights. The capacitive device also includes an insulating region between the first electrode and the second electrode; and at least one slot formed on one of the first electrode and the second electrode.

Consistent with the disclosed embodiments, there is also provided a circuit including at least one signal layer, a ground plane, at least one capacitive device, the at least one capacitive device including a first electrode and a second electrode, the second electrode being below the first electrode and spaced apart from the first electrode, wherein at least one of the first electrode and the second electrode includes a plurality of conductive step sections, the plurality of conductive step sections having different heights, a power plane; and an electronic device coupled to the circuit by at least one power contact and at least one ground contact.

Additional descriptions of the disclosed embodiments will be set forth in part in the description which follows, and in part will be obvious from the description, or may be learned by practice of the invention.

It is to be understood that both the foregoing general description and the following detailed description are exemplary and explanatory only and are not restrictive of the invention, as claimed.

BRIEF DESCRIPTION OF THE DRAWINGS

The foregoing summary, as well as the following detailed description of the invention, will be better understood when read in conjunction with the appended drawings. For the purpose of illustrating the disclosed embodiments, there are shown in the drawings examples that are presently preferred. It should be understood, however, that the invention is not limited to the precise arrangements and instrumentalities shown.

In the drawings:

FIG. 1A illustrates a schematic example of a capacitor device shown from a cross-sectional view;

FIG. 1B is a schematic top view of the capacitor device illustrated in FIG. 1A;

FIG. 2A illustrates another schematic example of a capacitor device shown from a cross-sectional view;

FIG. 2B is a schematic top view of the capacitor device illustrated in FIG. 2A;

FIG. 3A illustrates yet another schematic example of a capacitor device shown from a cross-sectional view;

FIG. 3B is a schematic bottom view of the capacitor device illustrated in FIG. 3A;

DETAILED DESCRIPTION OF THE DISCLOSED EMBODIMENTS

Figure 4A:
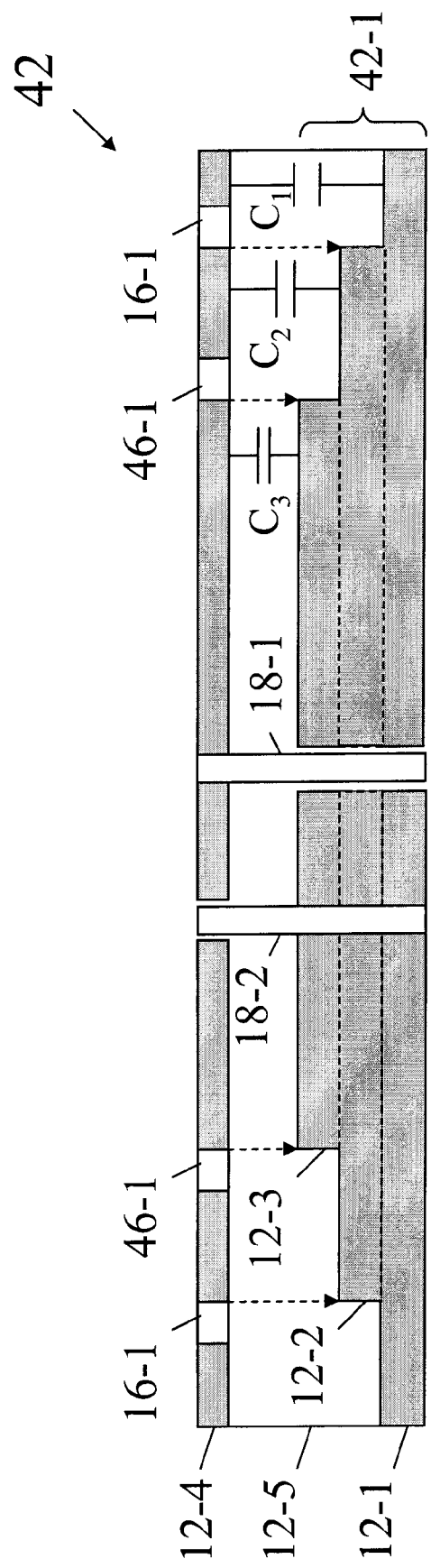
FIG. 4A illustrates still another schematic example of a capacitor device shown from a cross-sectional view.

Reference will now be made in detail to the present examples of embodiments consistent with the present invention illustrated in the accompanying drawings. Wherever possible, the same reference numbers will be used throughout the drawings to refer to the same or like portions. It should be noted that the drawings are in greatly simplified form and are not to precise scale. In reference to the disclosure herein, for purposes of convenience and clarity only, directional terms, such as top and bottom, are used with respect to the accompanying drawings. Such directional terms used in conjunction with the following description of the drawings should not be construed to limit the scope of the invention in any manner not explicitly set forth in the appended claims. It will also be apparent to one of ordinary skill in the art that a substrate, as discussed herein, may include not only printed circuit board (PCB), but may also include other types of organic and inorganic based substrates, such substrates comprised of semiconductor, organic, metal, and other materials. It will also be understood that the exemplary capacitor devices illustrated herein may be provided either as embedded within a substrate or as a SMD on the substrate.

FIG. 1A illustrates a schematic example of a capacitor device 12 shown from a cross-sectional view, and FIG. 1B is a schematic top view of capacitor device 12. Referring to FIG. 1A, which is a view taken along the direction of an arrow 11 shown in FIG. 1B, capacitor device 12 may include a multi-tier structure, which, as may be shown in FIG. 1A, for example, includes conductors having multiple conductive sections with each section corresponding to a tier or step. Capacitor device 12 may be provided in a number of manners, such as a SMD or embedded device. An example of the multi-tier capacitive structure may be found in a Taiwanese patent application No. 096144117, entitled "Multi-Tier Capacitor Structure, Fabrication Method Thereof and Semiconductor Substrate Having the Same," filed on Nov. 21, 2007 and assigned to the same assignee, which is incorporated herein by reference.

Capacitor device 12 may include a first electrode 12-4, a second electrode 12-3 including a first conductive tier 12-1 and a second conductive tier 12-2, and an insulating layer 12-5 located between first electrode 12-4 and second electrode 12-3. As shown in FIG. 1A, second electrode 12-3 has a plurality of conductive step sections formed by first conductive tier 12-1 and second conductive tier 12-2. For example, first conductive tier 12-1 forms a first conductive step section of second electrode 12-3, and second conductive tier 12-2 forms a second conductive step section of second electrode 12-3. A first capacitance $C_1$ may be provided between first electrode 12-4 and first conductive tier 12-1, while a second capacitance $C_2$ may be provided between first electrode 12-4 and the second conductive tier 12-2. The first electrode 12-4 may be electrically coupled to a contact, for example, a power plane, through a first conductive via 18-1. Furthermore, second electrode 12-3 including first tier 12-1 and second tier 12-2 may be electrically coupled to another contact, for example, a ground plane through a second conductive via 18-2.

A number of first slots 16-1 may be formed on first electrode 12-4 by a patterning and etching process and then filled with an insulating material. Referring to FIG. 1B, first slots 16-1 may be formed along a path aligned with the sides $S_2$ of second conductive tier 12-2, or the periphery of an effective capacitive region (shown in dotted lines) of second conductive tier 12-2. The effective capacitive region of a conductive tier may be defined by the area of the conductive tier of second electrode 12-3. In the present example, first conductive tier 12-1 has an effective capacitive region greater than that of second conductive tier 12-2. In one example, the number of first slots 16-1 may be related to the topology of the effective capacitive region of second conductive tier 12-2. For instance, in the present example, the effective capacitive region of second conductive tier 12-2 may be a rectangular shape and hence four first slots 16-1 may be formed. In another example, the effective capacitive region of second conductive tier 12-2 may be a triangular shape and three first slots 16-1 may be formed.

Furthermore, second slots 16-2 may also be formed on first electrode 12-4. Each second slot 16-2 may extend from one of the first slots 16-1 to one of the sides $S_1$ of an effective capacitive region of first conductive tier 12-1. With one or more first slots 16-1 and second slots 16-2, capacitor device 12 may provide several capacitive regions, in the present example, i.e., including first region $C_2$ and two second regions $C_{11}$. The effective capacitive regions of first conductive tier 12-1 and second conductive tier 12-2 may be divided into more capacitive regions if more isolation slots similar to first slots 16-1 and second slot 16-2 are formed. Capacitor device 12 may be electrically coupled to an electronic component through conductive vias 18-1 and 18-2. Capacitor device 12 having several capacitive regions consistent with embodiments of the present invention may provide a tunable range of capacitance by changing the isolation slots related to different topologies of the effective capacitive regions.

FIG. 2A illustrates a schematic example of another capacitor device 12 consistent with the disclosed embodiment shown from a cross-sectional view, and FIG. 2B is a schematic top view of capacitor device 12. As shown in FIG. 2A, capacitor device 12 may include a first electrode 12-4, a second electrode 12-3 including a first conductive tier 12-1 and a second conductive tier 12-2, and an insulating layer 12-5 located between first electrode 12-4 and second electrode 12-3. Second electrode 12-3 has a plurality of conductive step sections formed by first conductive tier 12-1 and second conductive tier 12-2. For example, first conductive tier 12-1 forms a first conductive step section of second electrode 12-3, and second conductive tier 12-2 forms a second conductive step section of second electrode 12-3. A first capacitance $C_1$ may be provided between first electrode 12-4 and first conductive tier 12-1, while a second capacitance $C_2$ may be provided between first electrode 12-4 and the second conductive tier 12-2. The first electrode 12-4 may be electrically coupled to a contact, for example, a power plane, through a first conductive via 18-1. Furthermore, second electrode 12-3 including first tier 12-1 and second tier 12-2 may be electrically coupled to another contact, for example, a ground plane through a second conductive via 18-2.

A number of first slots 16-1 may be formed on first electrode 12-4 by a patterning and etching process and then filled with an insulating material. Referring to FIG. 2B, first slots 16-1 may be formed along a path aligned with interior sides $S_2$ of second conductive tier 12-2, or the periphery of an effective capacitive region (shown in dotted lines) of second conductive tier 12-2. The effective capacitive region of a conductive tier may be defined by the area of the conductive tier of second electrode 12-3. In the present example, first conductive tier 12-1 has an effective capacitive region greater than that of second conductive tier 12-2. In one example, the number of first slots 16-1 may be related to the topology of the effective capacitive region of second conductive tier 12-2. For instance, in the present example, the effective capacitive region of second conductive tier 12-2 may be a rectangular shape and hence four first slots 16-1 may be formed. In another example, the effective capacitive region of second conductive tier 12-2 may be a triangular shape and three first slots 16-1 may be formed.

FIG. 3A illustrates yet another schematic example of a capacitor device 32 shown from a cross-sectional view, and FIG. 3B is a schematic bottom view of capacitor device 32. Referring to FIG. 3A, capacitor device 32 may be similar to capacitor device 12 described and illustrated with reference to FIGS. 1A and 1B except that, for example, slots 36-1 formed on the first conductive tier 12-1 of a second electrode 32-3 replace first slots 16-1 on first electrode 12-4. Slots 36-1 may be formed along a path aligned with the sides or periphery of the effective capacitive region of the second conductive tier 12-2 on first conductive tier 12-1 and then filled with an insulating material.

Referring to FIG. 3B, with slots 36-1, capacitor device 32 may provide a first region $C_1$ and a second region $C_2$ defined by slots 36-1. In other examples, capacitor device 32 may include but is not limited to a slot pattern such as that shown in FIG. 1B.

FIG. 4A illustrates still another schematic example of a capacitor device 42 shown from a cross-sectional view. Referring to FIG. 4A, capacitor device 42 may be similar to capacitor device 12 described and illustrated with reference to FIG. 1A except that, for example, a third conductive tier 12-3 of a second electrode 42-1 and at least one slot 46-1 on first electrode 12-4 are added. Capacitor device 42 thus includes a structure including three conductive step sections formed by first conductive tier 12-1, second conductive tier 12-2, and third conductive tier 12-3, in which a third capacitance $C_3$ may be provided between first electrode 12-4 and third conductive tier 12-3.

Figure 4B:
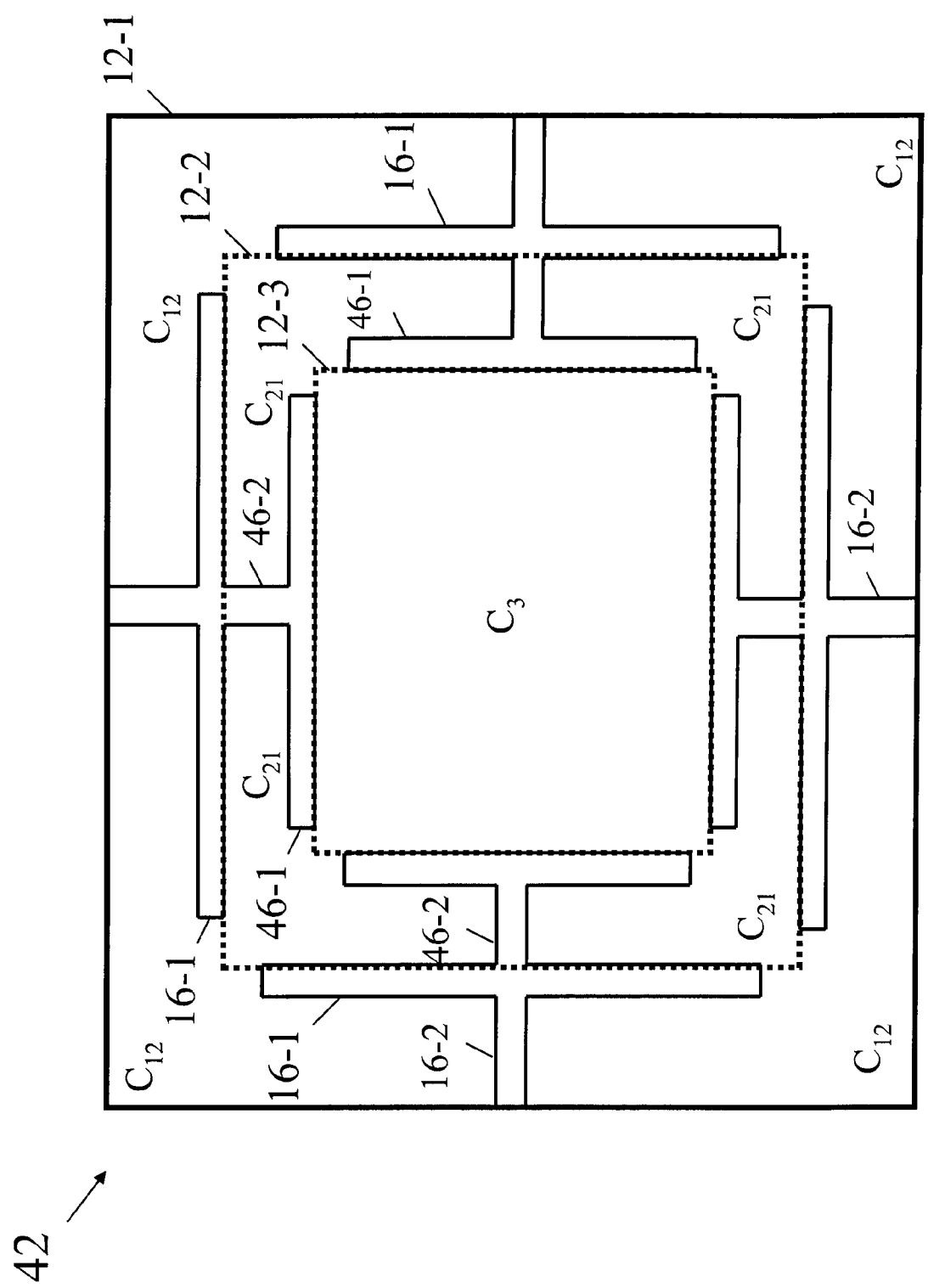
FIG. 4B is a schematic top view of the capacitor device illustrated in FIG. 4A.

FIG. 4B is a schematic top view of capacitor device 42 illustrated in FIG. 4A. Referring to FIG. 4B and FIG. 4A, at least one slot 46-1 on first electrode 12-4 may be formed along a path aligned with the sides or periphery of an effective capacitive region (shown in dotted lines) of third conductive tier 12-3 and then filled with an insulating material. Furthermore, at least one slot 46-2 may be formed between one of the first slots 16-1 and one of the slots 46-1. Consequently, capacitor device 42 may provide several capacitive regions, in the present example, i.e., four first capacitive regions $C_{12}$ defined by the first slots 16-1 and the second slots 16-2, four second capacitive regions $C_{21}$ defined by at least one slot 46-1, the first slots 16-1 and at least one slot 46-2, and a third capacitive region $C_3$ defined by at least one slot 46-1.

Figure 5A:
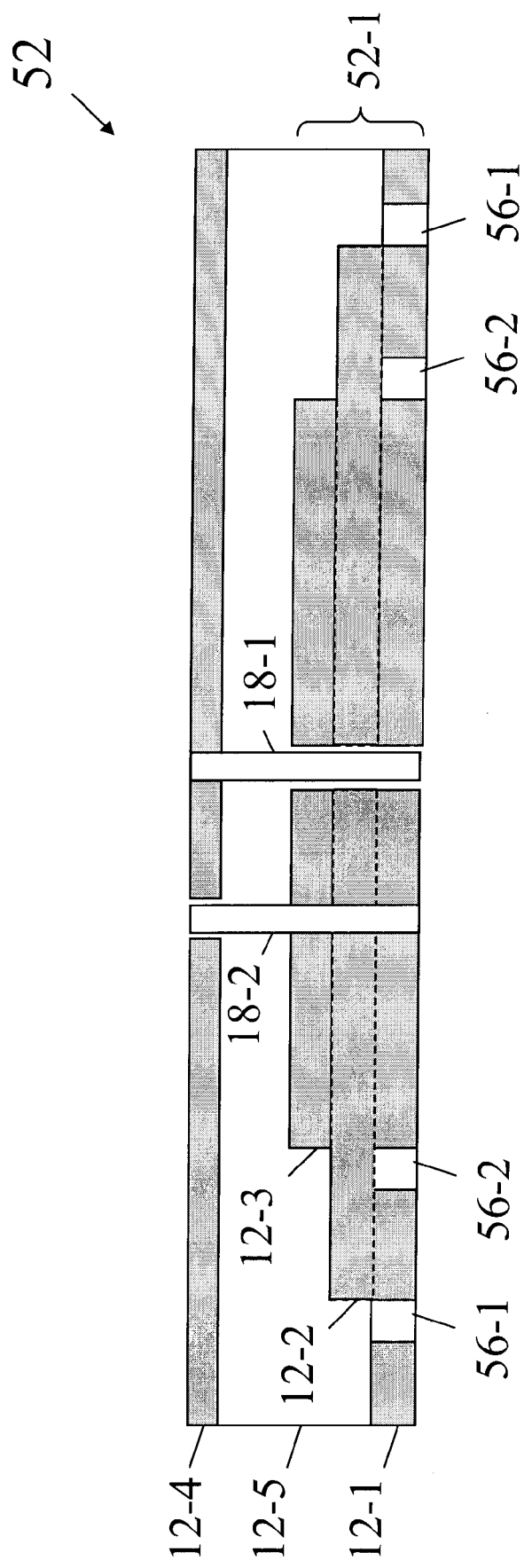
FIG. 5A illustrates yet still another schematic example of a capacitor device shown from a cross-sectional view.

FIG. 5A illustrates yet still another schematic example of a capacitor device 52 shown from a cross-sectional view. Referring to FIG. 5A, capacitor device 52 may be similar to the capacitor device 42 described and illustrated with reference to FIG. 4A except that, for example, at least one slot 56-1 and at least one slot 56-2 on first conductive tier 12-1 of a second electrode 52-1 replaces first slots 16-1 and at least one slot 46-1 on first electrode 12-4. The at least one slot 56-1 and slot 56-2 may be formed on first conductive tier 12-1 and then filled with an insulating material. In one example, each of the slots 56-1 may be formed along a path aligned with the sides or periphery of second conductive tier 12-2. Furthermore, each of the slots 56-2 may be formed along a path aligned with the sides or periphery of third conductive tier 12-3 and then filled with an insulating material.

Figure 5B:
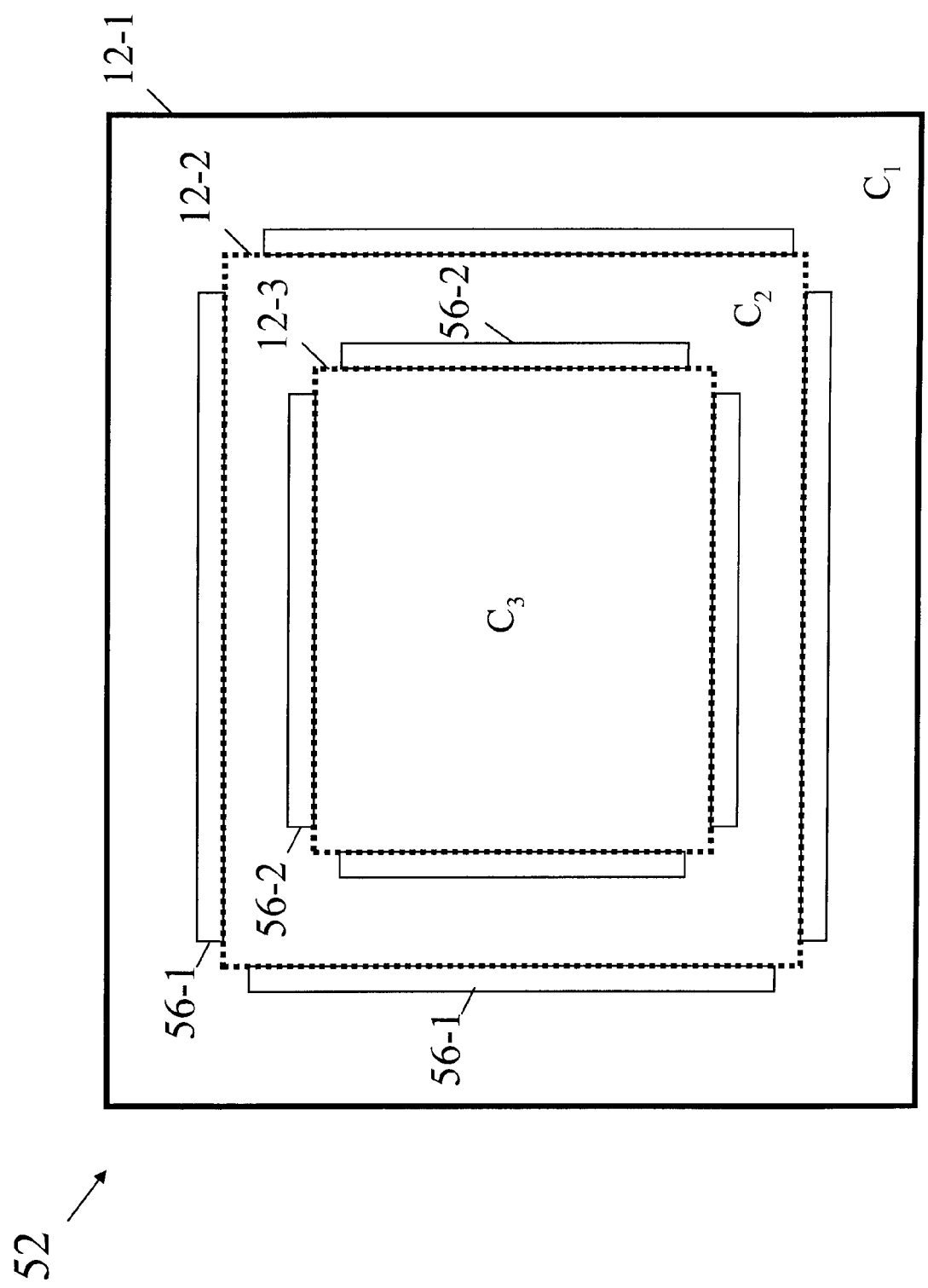
FIG. 5B is a schematic bottom view of the capacitor device illustrated in FIG. 5A.

FIG. 5B is a schematic bottom view of capacitor device 52 illustrated in FIG. 5A. Referring to FIG. 5B, with at least one slot 56-1 and at least one slot 56-2, capacitor device 52 may provide a first capacitive region $C_1$ defined by at least one slot 56-1, a second capacitive region $C_2$ defined by at least one slot 56-1 and at least one slot 56-2, and a third capacitive region $C_3$ defined by at least one slot 56-2. In other examples, capacitor device 52 may include, but is not limited to, a slot pattern such as that shown in FIG. 4B.

Figure 6:
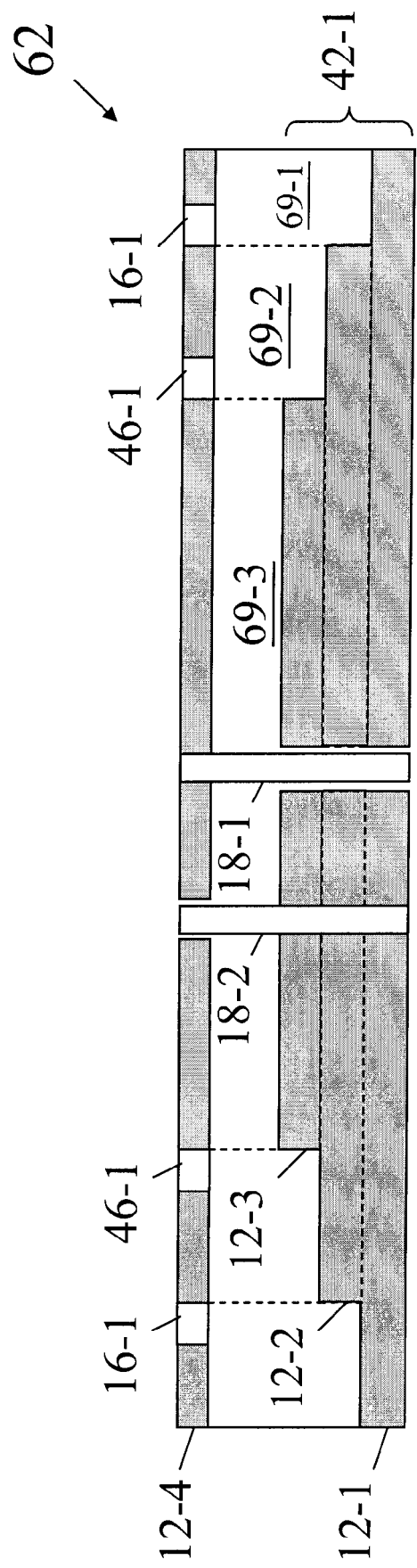
FIG. 6 illustrates yet another schematic example of a capacitor device shown from a cross-sectional view.

FIG. 6 illustrates yet another schematic example of a capacitor device 62 shown from a cross-sectional view. Referring to FIG. 6, capacitor device 62 may be similar to capacitor device 42 described and illustrated with reference to FIG. 4A except that, for example, a first insulating region 69-1, a second insulating region 69-2 and a third insulating region 69-3 replace the insulating layer 12-5. First insulating region 69-1 is formed between first conductive tier 12-1 and first electrode 12-4. Likewise, second insulating region 69-2 is formed between second conductive tier 12-2 and first electrode 12-4. Moreover, third insulating region 69-3 is formed between third conductive tier 12-3 and first electrode 12-4. First, second and third insulating regions 69-1, 69-2 and 69-3 may be contiguous and may be composed of insulating materials with different dielectric constants.

Figure 7:
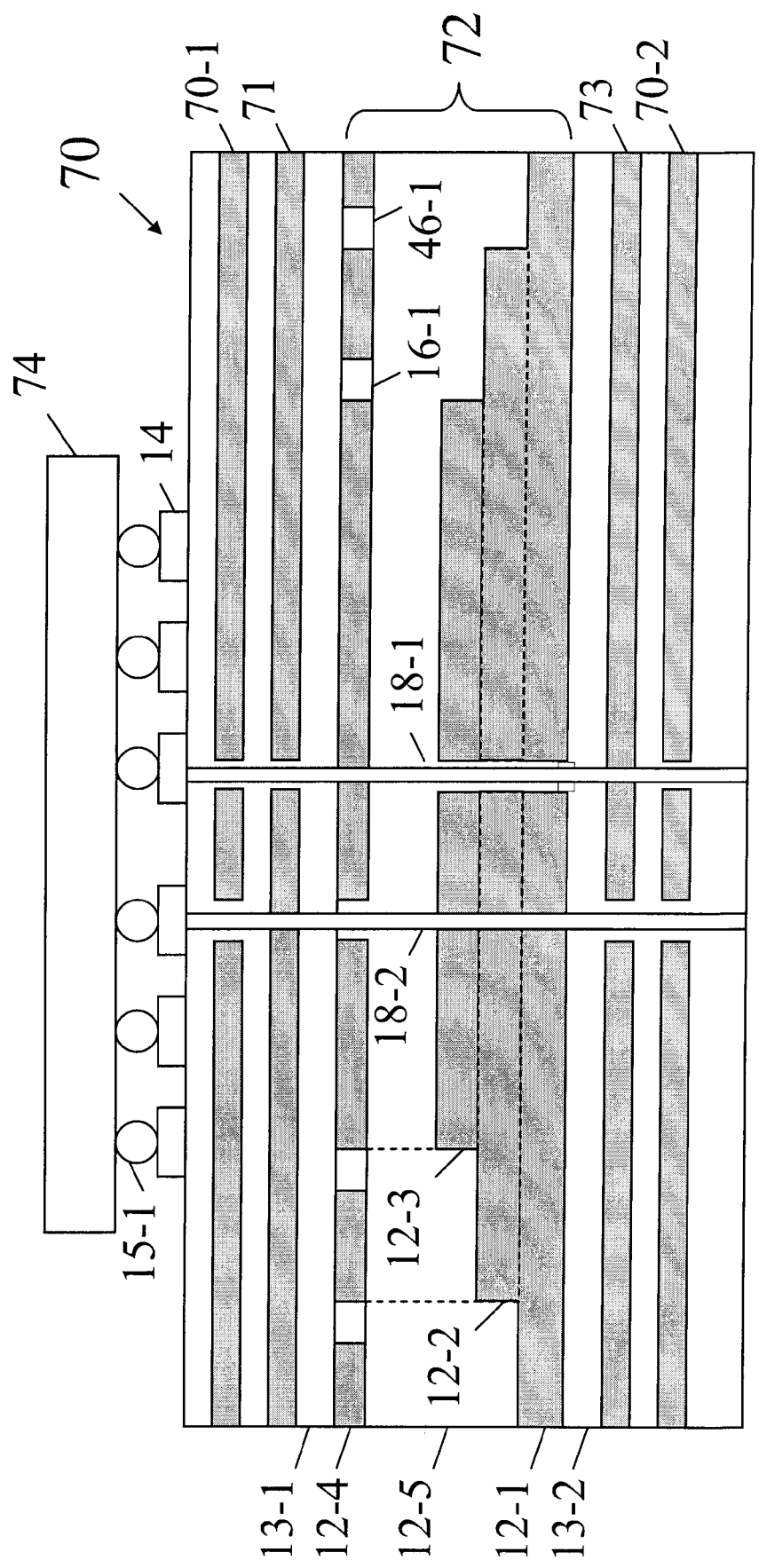
FIG. 7 illustrates still another schematic example of a capacitor device embedded in a circuit board shown from a cross-sectional view.

FIG. 7 illustrates still another schematic example of a capacitor device 72 embedded in a circuit board 70 shown from a cross-sectional view. Referring to FIG. 7, circuit board 70 may include a first signal layer 70-1, a ground plane 71, capacitor device 72, a power plane 73 and a second signal layer 70-2. Capacitor device 72 in the present example may include three conductive step sections formed by first conductive tier 12-1, second conductive tier 12-2, and third conductive tier 12-3 similar to capacitor device 42 described and illustrated with reference to FIG. 4A. Capacitor device 72 may also be another one of exemplary devices illustrated and described above or another capacitor device consistent with the description and illustrations above. For example, capacitor device 72 may include a 2-tier capacitive structure or a capacitive structure having four or more tiers.

First electrode 12-4 of capacitor device 72 may be coupled to power plane 73 through one or more first conductive vias 18-1, while second electrode including three tiers 12-1 to 12-3 of capacitor device 72 may be coupled to ground plane 71 through one or more second conductive vias 18-2. With conductive vias 18-1 and 18-2, capacitor device 72 having multi-sectional conductors may be electrically coupled to electronic device 74 such as an integrated circuit (IC) on the circuit board 70.

Conductive vias 18-1 and 18-2 may be electrically coupled to the electronic device 74 through electronic device contacts 14 coupled to individual ones of ball solder contacts 15-1, which are in turn connected to contacts of electronic device 74. Other connection methods known in the art may also be used to electrically connect conductive vias 18-1 and 18-2 with electronic device 74. Electronic device 74 may include any of a number of devices known in the art.

Insulating layers 13-1 and 13-2 may be provided between interconnect layers or other types of layers found in devices. For example, as illustrated here, insulating layer 13-1 is provided between ground plane 71 and capacitor device 72 and insulating layer 13-2 is provided between capacitor device 72 and power plane 73.

In accordance the disclosed embodiments, a capacitive device having multiple conductive step sections as described herein may be embedded in the substrates of electronic circuitry systems. For example, a capacitive device having multiple conductive step sections consistent with the disclosed embodiments may be used in silicon substrates, ceramic substrates, glass substrates, and flexible substrates. In accordance with additional disclosed embodiments, a capacitive device having multiple conductive step sections may also be used in printed circuit boards and chip carriers. A capacitive device having multiple conductive step sections according to the disclosed embodiments may also be used in package structures such as system-in-package (SIP) structures, system-on-package (SOP) structures, system-on-module (SOM) structures, three-dimensional stacking package structures, three-dimensional stacking integrated circuit structures, package-on-package (POP) structures, carrier stacking structures, and in socket structures.

Furthermore, in describing the disclosed embodiments, a description herein may have presented a method and/or process as a particular sequence of steps. However, to the extent that any method or process described herein does not rely on the particular order of steps set forth herein, the method or process should not be limited to the particular sequence of steps described. As one of ordinary skill in the art would appreciate, other sequences of steps may be possible. Therefore, the particular order of the steps set forth herein should not be construed as limitations on the claims. In addition, any claims directed to the method and/or process consistent with the disclosed embodiments should not be limited to the performance of their steps in the order written, and one skilled in the art can readily appreciate that the sequences may be varied and still remain within the spirit and scope of the disclosed embodiments.

It will be appreciated by those skilled in the art that changes could be made to the examples described above without departing from the broad inventive concept thereof. It is understood, therefore, that the disclosed embodiments are not limited to the particular examples disclosed, but it is intended to cover modifications within the spirit and scope of the disclosed embodiments as defined by the claims that follow.

What is claimed is:

1. A capacitive device, comprising:
    a first electrode;
    a second electrode below the first electrode and spaced apart from the first electrode, the second electrode including at least:
        a first conductive step section forming a first effective capacitive region with the first electrode; and
        a second conductive step section forming a second effective capacitive region with the first electrode, the conductive conductive step sections having different heights;
    an insulating region between the first electrode and the second electrode;
    at least one first slot formed on the first electrode and along a path aligned with a periphery of the second effective capacitive region; and
    at least one second slot extending from the at least one first slot and overlapping a portion of a periphery of the first effective conductive region.

2. The capacitive device of claim 1, wherein the first conductive step section has a first upper surface at a first height and the second conductive step section has a second upper surface at a second height, wherein the second height is greater than the first height.

3. The capacitive device of claim 1, wherein an area of the second effective capacitive region is different from an area of the first effective capacitive region.

4. The capacitive device of claim 1, wherein the insulating region comprises:
    a first insulating region between the first conductive step section and the first electrode, the first insulating region having a first dielectric constant; and
    a second insulating region between the second conductive step section and the first electrode, the second insulating region having a second dielectric constant, the first dielectric constant and the second dielectric constant being different from each other.

5. The capacitive device of claim 1, wherein:
    the second electrode further comprises a third conductive step section having a third upper surface having a third height, the third height being greater than the second height;
    the third conductive step section forms a third effective capacitive region with respect to the first electrode, the third capacitive region being different from at least one of the first effective capacitive region and second effective capacitive region; and
    at least one third slot formed on the first electrode along a path aligned with a periphery of the third effective capacitive region of the third conductive step section.

6. The capacitive device of claim 5, wherein the insulating region comprises:
    a first insulating region between the first conductive step section and the first electrode, the first insulating region having a first dielectric constant;
    a second insulating region between the second conductive step section and the first electrode, the second insulating region having a second dielectric constant; and
    a third insulating region between the third conductive step section and the first electrode, the third insulating region having a third dielectric constant.

7. A circuit, comprising:
    at least one signal layer;
    a ground plane;
    at least one capacitive device including:
        a first electrode; and
        a second electrode below the first electrode and spaced apart from the first electrode, the second electrode comprising at least:
            a first conductive step section forming a first effective capacitive region with the first electrode; and
            a second conductive step section forming a second effective capacitive region with the first electrode, the conductive step sections having different heights;
        an insulating region between the first electrode and the second electrode;
        at least one first slot formed on the first electrode and along a path aligned with a periphery of the second effective capacitive region; and
        at least one second slot extending from the at least one first slot and overlapping a portion of a periphery of the first effective conductive region;
    a power plane; and
    an electronic device coupled to the circuit by at least one power contact and at least one ground contact.

8. The circuit of claim 7, wherein
    the ground contact is coupled to the ground plane through a first via; and
    the power contact is coupled to the power plane through a second via.

9. The circuit device of claim 7, wherein the first conductive step section has a first upper surface at a first height and the second conductive step section has a second upper surface at a second height, wherein the second height is greater than the first height.

10. The circuit of claim 7, wherein an area of the first effective capacitive region is different from an area of the second effective capacitive region.

11. The circuit of claim 7, wherein the insulating region comprises:
    a first insulating region between the first conductive step section and the first electrode, the first insulating region having a first dielectric constant; and
    a second insulating region between the second conductive step section and the first electrode, the second insulating region having a second dielectric constant, the first dielectric constant and the second dielectric constant being different from each other.

12. The circuit of claim 7, wherein:
    the second electrode further comprises a third conductive step section having a third upper surface having a third height, the third height being greater than the second height;

the third conductive step section forms a third effective capacitive region with respect to the first electrode, the third effective capacitive region being different from at least one of the first effective capacitive region and second effective capacitive region; and at least one third slot formed on the first electrode along a path aligned with a periphery of the third effective capacitive region of the third conductive step section.

13. The circuit of claim 7, wherein the circuit comprises a printed circuit board embedded in a substrate of an integrated circuit.

14. The circuit of claim 12, wherein the insulating region comprises:

a first insulating region between the first conductive step section and the first electrode, the first insulating region having a first dielectric constant;

a second insulating region between the second conductive step section and the first electrode, the second insulating region having a second dielectric constant; and a third insulating region between the third conductive step section and the first electrode, the third insulating region having a third dielectric constant.

* * * * *